(12) United States Patent
Tsai et al.

(10) Patent No.: US 8,906,789 B2
(45) Date of Patent: Dec. 9, 2014

(54) ASYMMETRIC CYCLIC DESPOSITION ETCH EPITAXY

(71) Applicant: Taiwan Semiconductor Manufacturing Co. Ltd., Hsin-Chu (TW)

(72) Inventors: Chun Hsiung Tsai, Xinpu Township (TW); Yi-Fang Pai, Hsinchu (TW); Chien-Chang Su, Kaohsiung (TW); Tzu-Chun Tseng, Changhua (TW); Meng-Yueh Liu, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/873,323

(22) Filed: Apr. 30, 2013

(65) Prior Publication Data

US 2014/0264348 A1    Sep. 18, 2014

Related U.S. Application Data (60) Provisional application No. 61/780,520, filed on Mar. 13, 2013, provisional application No. 61/780,784, filed on Mar. 13, 2013, provisional application No. 61/792,596, filed on Mar. 15, 2013.

(51) Int. Cl.
*H01L 21/00*  (2006.01)
*H01L 29/78*  (2006.01)
*C30B 25/16*  (2006.01)

(52) U.S. Cl.
CPC ............ *C30B 25/165* (2013.01); *H01L 29/785* (2013.01); *C30B 25/16* (2013.01); *Y10S 438/938* (2013.01)

USPC ............. 438/482; 438/484; 438/938; 257/57; 257/18

(58) Field of Classification Search
CPC .... H01L 21/0237; C30B 25/16; C30B 25/165
USPC ....................... 438/482, 484, 938; 257/57, 18
See application file for complete search history.

(56) References Cited

U.S. PATENT DOCUMENTS 6,417,092 B1 * 7/2002 Jain et al. ..................... 438/624

* cited by examiner

*Primary Examiner* — Tu-Tu Ho
(74) *Attorney, Agent, or Firm* — Eschweiler & Associates, LLC (57) ABSTRACT

The present disclosure relates to a method of forming an epitaxial layer through asymmetric cyclic deposition etch (CDE) epitaxy. An initial layer growth rate of one or more cycles of the CDE process are designed to enhance a crystalline quality of the epitaxial layer. A growth rate of the epitaxial material may be altered by adjusting a flow rate of one or more silicon-containing precursors within a processing chamber wherein the epitaxial growth takes place. An etch rate may also be altered by adjusting a temperature or partial pressure of one or more vapor etchants, or the temperature within the processing chamber. In some embodiments, an initial layer thickness that is greater than a critical thickness of the epitaxial material for strain relaxation is achieved with a low growth rate, followed by a high growth rate for the remainder of epitaxial growth. Other methods are also disclosed.

20 Claims, 9 Drawing Sheets

ASYMMETRIC CYCLIC DESPOSITION ETCH EPITAXY

CROSS REFERENCE TO RELATED APPLICATIONS

This application is a Non-Provisional application claiming priority to Provisional Patent Application Ser. No. 61/780,520 filed on Mar. 13, 2013, Provisional Patent Application Ser. No. 61/780,784 filed on Mar. 13, 2013, and Provisional Patent Application Ser. No. 61/792,596 filed on Mar. 15, 2013, and are hereby incorporated by reference.

BACKGROUND

Epitaxial growth techniques in semiconductor manufacturing are utilized to deposit a crystalline layer on a crystalline substrate, wherein the deposited layer matches a crystallographic configuration of the substrate. Homoepitaxial layers comprise a same composition as the substrate. Heteroepitaxial layers comprise a different composition than the substrate. Size variation between the particles comprising the substrate material and the particles comprising the heteroepitaxial layer induces strain on the heteroepitaxial layer below a critical thickness.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

It is also noted that the present disclosure presents embodiments in the form of multi-gate transistors or fin-type multi-gate transistors referred to herein as finFET devices. Such a device may include a p-type metal oxide semiconductor finFET device or an n-type metal oxide semiconductor finFET device. The finFET device may be a dual-gate device, tri-gate device, and/or other configuration. FinFET devices may be included in an integrated circuit (IC) such as a microprocessor, memory device, and/or other IC. The IC may also include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize other embodiments of semiconductor devices that may benefit from aspects of the present disclosure.

Cyclic deposition etch (CDE) epitaxy provides method to form a high-quality epitaxial layer on a crystalline substrate while continuously removing malformed amorphous portions. Some CDE approaches comprise epitaxial growth on a silicon (Si) substrate with one or more silicon-containing precursors such as silane ($SiH_4$) through a periodic application, wherein the Si substrate is exposed to a pulse of the silicon-containing precursor for a first period of time, followed by a second period of time wherein the Si substrate is exposed to no precursor, followed by a third period of time wherein the Si substrate is again exposed to the pulse of the silicon-containing precursor, and so on, until a desired epitaxial layer thickness is achieved. Throughout the CDE process, the substrate is exposed to a continuous flow of one or more vapor etchants such as hydrogen chloride (HCl) configured to selectively etch away amorphous portions of the epitaxial layer while leaving crystalline portions intact, facilitating an amorphous or polysilicon (poly-Si) etch rate of the one or more vapor etchants which is several times higher a monocrystalline etch rate.

Some CDE methods utilize a static epitaxial recipe for a respective cycle, resulting in a nearly uniform growth rate per cycle throughout the CDE process. Depending on crystalline quality of a Si substrate or dielectric seed material such as buried oxide (BOX), the initial layer growth rate will determine a crystalline quality of the epitaxial layer. The crystalline quality may be degraded by amorphous or polycrystalline growth, dislocations, interstitials, etc. One failure mechanism identified within semiconductor device manufacturing through CDE is a dislocation formation at a source or drain interface to a gate corner of a FET which can degrade FET performance.

Accordingly, the present disclosure relates to a method of forming an epitaxial layer through asymmetric cyclic deposition etch (CDE) epitaxy, wherein an initial layer growth rate of one or more cycles of the CDE process are designed to enhance a crystalline quality of the epitaxial layer. A growth rate of the epitaxial material may be altered by adjusting a flow rate of one or more silicon-containing precursors within a processing chamber wherein the epitaxial growth takes place. An etch rate may also be altered by adjusting a temperature or partial pressure of one or more vapor etchants, or the temperature within the processing chamber. In some embodiments, an initial layer thickness that is greater than a critical thickness of the epitaxial material for strain relaxation is achieved with a low growth rate, followed by a high growth rate for the remainder of epitaxial growth. Other methods are also disclosed.

CDE comprises a sequence of consecutive deposition and etch steps. For a silicon-containing source vapor deposited through an epitaxial growth method such as chemical vapor deposition (CVD), impurities within a source vapor or growth chamber or other mechanisms can result in lattice defects, impurities, and/or a degradation of crystal quality within the epitaxial layer as a thickness of the epitaxial layer is increased. As such, after a first pulse of epitaxial growth is achieved, removal of amorphous or polycrystalline portions of the epitaxial layer is achieved through a selective etch within the CDE process, followed by a second pulse of epitaxial growth, and so on, until the epitaxial layer achieves a desired thickness. In some embodiments, halide gases, such as chlorine $Cl_2$ or hydrogen chloride HCl are employed as selective etchants for a Si substrate to perform the selective etch of the amorphous or polycrystalline portions of the epitaxial layer. In some embodiments, an HCl etch rate of amorphous or polycrystalline Si that is several times higher than that of monocrystalline Si is achieved under etch conditions comprising a temperature between approximately 450° C. and approximately 750° C., a pressure between approximately 1 Torr and approximately 600 Torr, and a duration of between approximately 5 seconds and approximately 200 seconds. In some embodiments, a silicon-containing source vapor is utilized, comprising silane ($SiH_4$), di-silane ($Si_2H_6$), or trisilane ($Si_3H_8$) introduced into a processing chamber periodically during deposition, and disposing a silicon-containing epitaxial layer within the recess. Additional steps may include an anneal operation after operation to activate dopants or drive dopants into a lightly-doped-drain (LDD) region prior to, or subsequent to the CDE process.

Figure 1A:
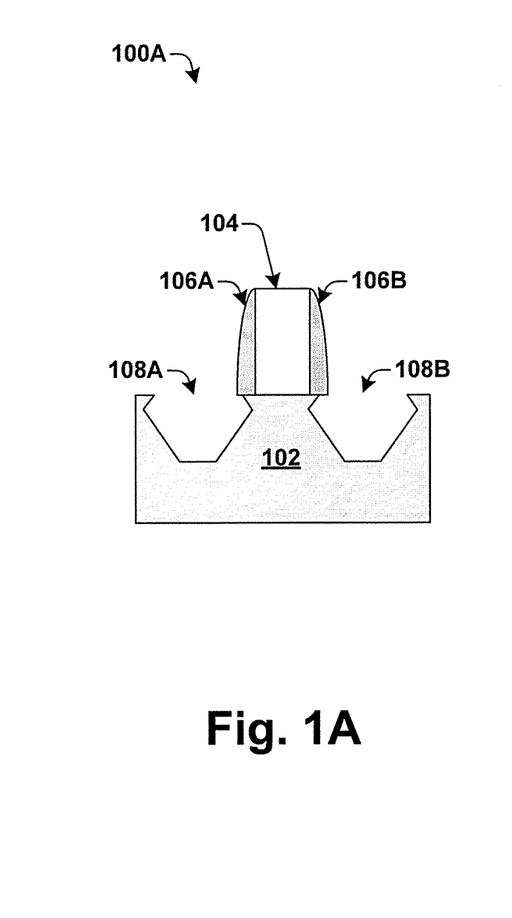
FIGS. 1A-1F illustrate cross-sectional views of some embodiments of epitaxial layer growth within a recess of a planar field-effect transistor (FET) through asymmetric cyclic deposition epitaxy (CDE).

FIGS. 1A-1F illustrate cross-sectional views of some embodiments of epitaxial layer growth within a recess of a planar field-effect transistor (FET) through asymmetric cyclic deposition epitaxy (CDE). FIG. 1A illustrates a cross-sectional view 100A of some embodiments of a FET formed on an Si substrate 102 comprising a gate 104 isolated from a source region by a first spacer 106A, and isolated from a drain region by a second spacer 106B, wherein a first recess 108A is formed in the source region, and a second recess 108B is formed in the drain region. Formation of the first recess 108A and the second recess 108B may comprise one or more etching process(es), including but not limited to a dry process(es) such as a plasma etching process, wet etching process(es), or a combination of both. In some embodiments, a wet etch is used to form the first recess 108A and the second recess 108B. For example, an etchant such as carbon tetrafluoride ($CF_4$), HF, tetramethylammonium hydroxide (TMAH), or combinations of thereof, or the like may be used to perform the wet etch and form the first recess 108A and the second recess 108B.

The first recess 108A and the second recess 108B may comprise a width of between approximately 50 Å and approximately 500 Å, in accordance with some embodiments, and a depth in a range from approximately 50 Å and approximately 600 Å. However, these dimensions are not intended to limit the present embodiments, as any suitable dimensions for the first recess 108A and the second recess 108B may comprise may alternatively be utilized.

The substrate 102 may be a silicon substrate. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 102 is a semiconductor on insulator (SOI).

Figure 1B:
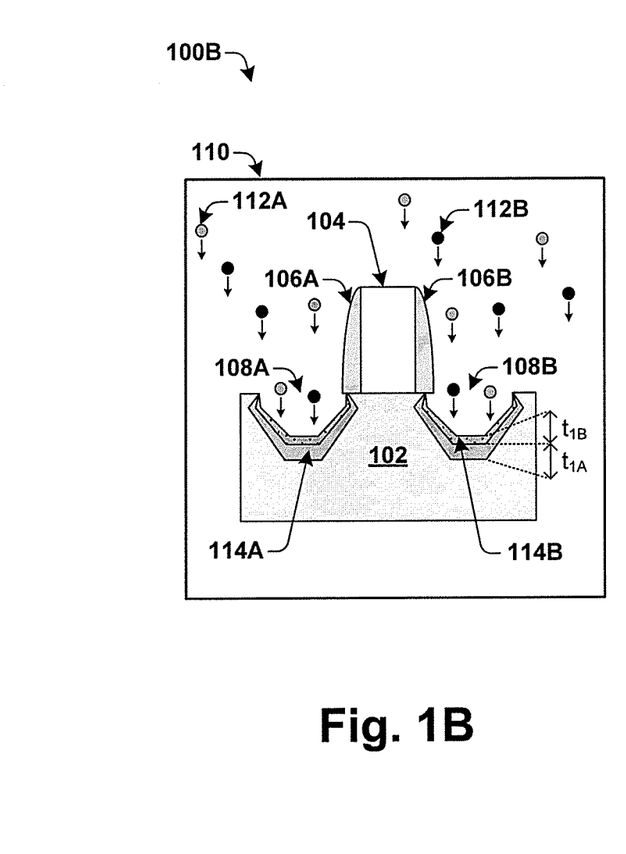

FIG. 1B illustrates a cross-sectional view 100B of the FET of FIG. 1A residing within a processing chamber 110, wherein a first layer of epitaxial material (114A and 114B) is disposed within the first recess 108A and the second recess 108B. Within the processing chamber 110, the FET of FIG. 1A is exposed to a continuous flow of etchant particles 112A (e.g., $Cl_2$ or HCl) configured to continuously and selectively remove amorphous portions 114B of the epitaxial material from the substrate 102, along with one or more source vapors 112B configured to deposit the first layer within the first recess 108A and the second recess 108B with a first growth rate. The first layer comprises one or more crystalline portions 114A comprising a first crystal thickness ($t_{1A}$) and one or more amorphous portions 114B comprising a first amorphous thickness ($t_{1B}$).

Note that the one or more crystalline portions 114A and the one or more amorphous portions 114B of the first layer of the epitaxial material deposit on a bottom surface and sidewalls of the first recess 108A and the second recess 108B with varying thickness. For the embodiments of FIGS. 1A-1F, the first crystal thickness ($t_{1A}$), the amorphous thickness ($t_{1B}$), and thicknesses of subsequent layers of the epitaxial material are illustrated as a thickness at the bottom surface, but may also comprise an average thickness, a maximum thickness, minimum thickness, etc. Note further that the layer deposition steps illustrated in the embodiments of FIGS. 1A-1F show the one or more crystalline portions 114A and the one or more amorphous portions 114B as separate and distinct layers. A more realistic portrayal may illustrate the one or more crystalline portions 114A and the one or more amorphous portions 114B as distinct regions within a single layer comprising sizes of less than approximately 100 nm. The illustrations in the embodiments of FIGS. 1A-1F are simply for ease of understanding. Note also that for the embodiments of FIGS. 1A-1F the first recess 108A and the second recess 108B are illustrated as diamond-shaped recesses, but in general may comprise any recess profile shape.

Figure 1C:
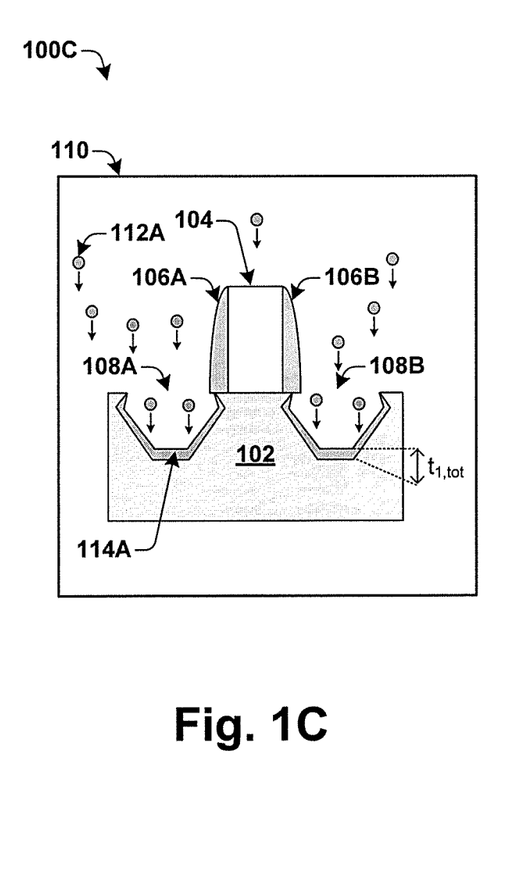

FIG. 1C illustrates a cross-sectional view 100C of the FET of FIG. 1A residing within the processing chamber 110, wherein the one or more source vapors 112B have been turned off to allow the continuous flow of etchant particles 112A to selectively removes the amorphous portions 114B of the first layer, and leaving at least part of the one or more crystalline portions 114A comprising a total first layer thickness ($t_{1,tot}$). Note that while the selectivity of the continuous flow of etchant particles 112A is tuned to etch the amorphous portions 114B at a higher rate than the crystalline portions 114A, etching of the crystalline portions 114A will occur, thus resulting in the total first layer thickness ($t_{1,tot}$) which is less than the first crystal thickness ($t_{1A}$). In some embodiments, the etch chemistry may also contain a germanium source, such as monogermane ($GeH_4$) to increase a selective etch rate of amorphous or poly-crystalline Si. In some embodiments, the first growth rate comprises a value between approximately 1 nm and approximately 10 nm per cycle, wherein the total first layer thickness ($t_{1,tot}$) comprises a value between approximately 1 nm and approximately 10 nm. In some embodiments, the total first layer thickness ($t_{1,tot}$) comprises a value greater than a critical thickness of the epitaxial material to achieve strain relaxation.

Figure 1D:
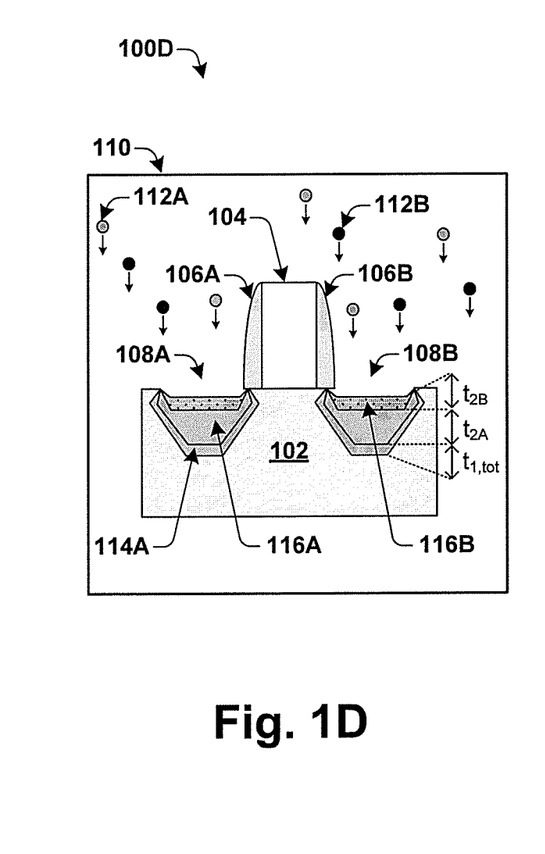

FIG. 1D illustrates a cross-sectional view 100D of the FET of FIG. 1A residing within the processing chamber 110, wherein a second layer of epitaxial material (116A and 116B) is formed within the first recess 108A above the first layer (i.e., crystalline portions 114A) and within the second recess 108B above the first layer by the one or more source vapors 112B configured to deposit the second layer with a second growth rate. In some embodiments, FET of FIG. 1A is periodically exposed to the one or more source vapors 112B to create the first layer within a first period, and the second layer within a second period, etc. The second layer comprises one or more crystalline portions 116A comprising a second crystal thickness ($t_{2A}$) and one or more amorphous portions 116B comprising a second amorphous thickness ($t_{2B}$). Again these layers are illustrated as such to facilitate understanding.

Figure 1E:
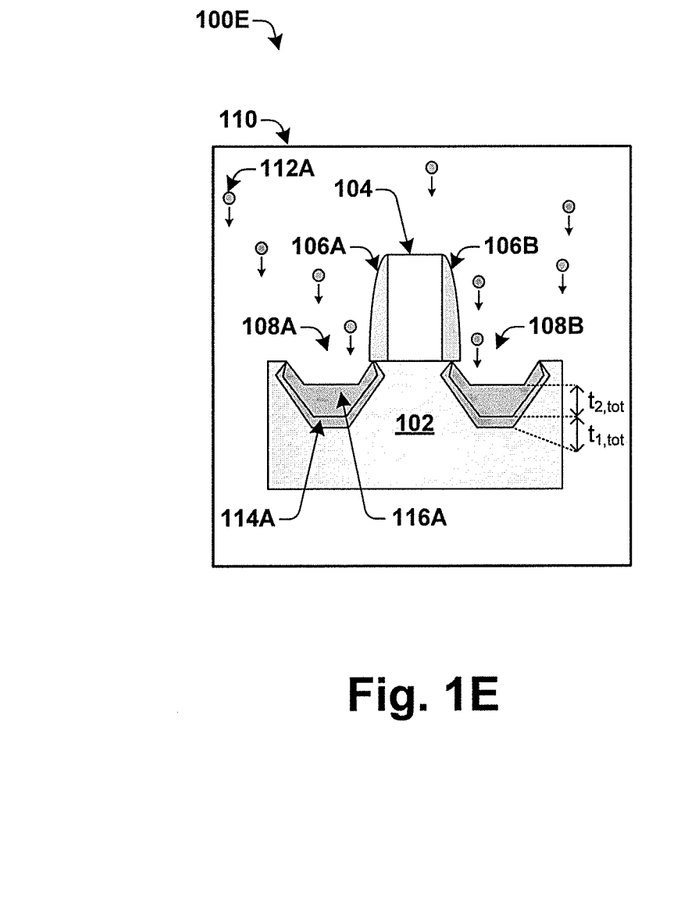

FIG. 1E illustrates a cross-sectional view 100E of the FET of FIG. 1A residing within the processing chamber 110, wherein the one or more source vapors 112B have been again turned off to allow the flow of etchant particles 112A to continuously and selectively etch the amorphous portions 116B of the second layer, leaving at least a portion of the one or more crystalline portions 116A comprising a total second layer thickness ($t_{2,tot}$). In some embodiments, the second growth rate comprises a value between approximately 1 nm and approximately 40 nm per cycle to achieve accelerated growth on the first layer relative to the first growth rate.

Figure 1F:
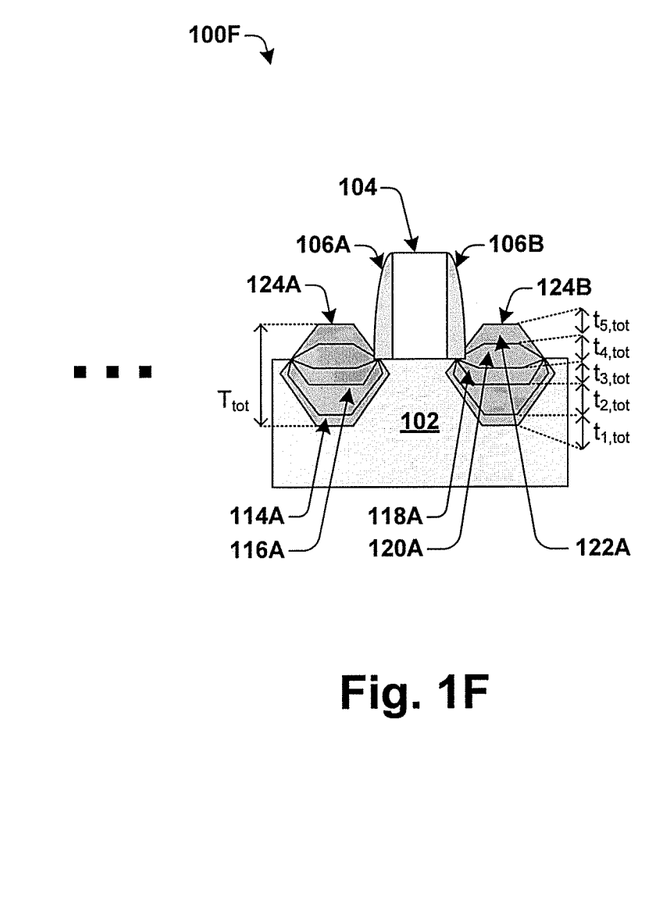

FIG. 1F illustrates a cross-sectional view 100F of the FET of FIG. 1A, wherein periodically exposing the substrate 102 to the one or more source vapors 112B while continuously exposing the substrate 102 to the continuous flow of etchant particles 112A for three additional periods (i.e., a total of five periods) results in a third layer 118A comprising total third layer thickness ($t_{3,tot}$) disposed above the second layer 116A, fourth layer 120A comprising a fourth layer thickness ($t_{4,tot}$) disposed above the third layer 118A, and fifth layer 122A comprising a fifth layer thickness ($t_{5,tot}$) disposed above the fourth layer 120A. The first layer 114A, the second layer 116A, the third layer 118A, the fourth layer 120A, and the fifth layer 122A of the epitaxial material comprise crystalline portions and form a first raised source/drain (RSD) junction 124A within the first recess 108A and a second RSD junction 124B within the second recess 108B. In some embodiments, the source region (e.g., SiGe, SiC, etc.) and the drain region abut a buried oxide (BOX) configured to isolate the source region and the drain region from nearby devices or electrical effects. Similarly, one or more spacers isolate the gate from the source region and the drain region.

The epitaxial material disposed within a recess within is configured to produce a strain within a channel of the device to enhance mobility of charge carriers. In some embodiments, the epitaxial material comprises silicon-germanium (SiGe) utilized to induce compressive strain for a PFET to enhance charge carrier mobility comprising hole mobility due to the due to the larger lattice constant of Ge compared to Si. In some embodiments, the epitaxial material comprises silicon-carbide (SiC) utilized to induce tensile strain in an NFET to enhance charge carrier mobility comprising electron mobility due to the smaller lattice constant of carbon compared to Si.

In some embodiments, the epitaxial material comprises a silicon-containing material disposed in-situ. For example, forming an n-type transistor can use an n-type doping precursor such as phosphine ($PH_3$) and/or other n-type doping precursor. By using the in-situ doping process, the dopant concentration (or level) of the silicon-containing material can be desirably controlled and achieved. In some embodiments, the silicon-containing material can be an n-type doped silicon layer that is doped with phosphorus (Si:P). In some embodiments, the silicon-containing material can be an n-type doped silicon layer that is doped with both phosphorus and carbon (Si:CP). Carbon could impede the out-diffusion of phosphorus from the silicon-containing material. Other types of dopants may also be included. In some embodiments, the phosphorus dopant has a concentration in a range from about 7E20 atoms/$cm^3$ to about 3E21 atoms/$cm^3$. In some embodiments, the carbon dopant has a concentration in a range from about 0.1% to about 5% (atomic percent).

In some embodiments, the silicon-containing material can be formed by a CDE process comprising chemical vapor deposition (CVD), low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; and/or any combinations thereof. In some embodiments, upper layers of the epitaxial material may be formed by a non-CDE epitaxial process. The CDE process is relatively slow; therefore, it could be desirable to use an alternative epitaxial process to form upper epitaxial layers once the initial high-quality layer and one or more upper layers are formed. For example, a selective epitaxial growth (SEG) process comprising simultaneous deposition and etch may be used to deposit the second silicon-containing material. The SEG process has a higher growth rate than the CDE process, in accordance with some embodiments. The SEG process is a selective deposition process and the silicon-containing material formed by this process deposits on epitaxial silicon-containing material (e.g., the fourth layer 120A and the fifth layer 122A are formed via SEG on the first layer 114A, the second layer 116A, and the third layer 118A which are formed via CDE in accordance with the embodiments of FIGS. 1A-1F).

Figure 2A:
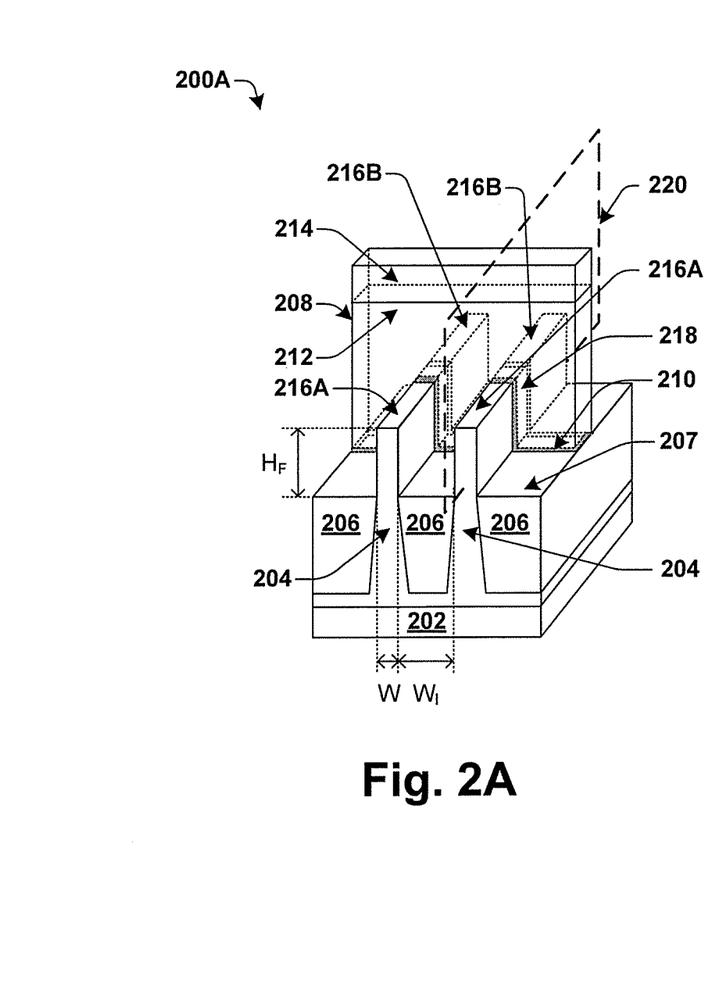
FIGS. 2A-2H illustrate cross-sectional views of some embodiments of epitaxial layer growth of strained source and drain regions of a finFET through asymmetric CDE.

FIG. 2A illustrates some embodiments of a perspective view of a semiconductor device structure 200A comprising a finFET-type structure, further comprising a substrate 202, a plurality of fins 204, a plurality of isolation structures 206, and a gate structure 208 disposed over each of the fins 204. In some embodiments the gate structure 208 may comprise a metal gate structure further comprising a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers. In the embodiments of FIGS. 2A-2H, the gate structure 208 includes a gate dielectric layer 210, a gate electrode layer 212, and/or one or more additional layers. A hard mask layer 214 is disposed over the gate electrode layer 212, and configured to block etching of the gate structure 208 during to patterning. In some embodiments, the hard mask layer 214 is made of a dielectric material, such as silicon oxide. Although FIG. 2A shows only one gate structure 208, additional gate structure(s) may be similarly placed parallel to the gate structure 208. For the device structure 200A, each of the plurality of fins 204 include a source region 216A and a drain region 216B, wherein source or drain features are formed in, on, and/or surrounding the fin 204. A channel region 218 of the fin 204 underlies the gate structure 208.

Each fin 204 has a portion protruding above surfaces 207 of neighboring isolation structures 206, and comprises a height $H_F$ and a width W (also called gate width). In some embodiments, $H_F$ is in a range from approximately 25 nm to approximately 35 nm, and a distance $W_I$ between top portions of the fins 204 is in a range from about 10 nm to about 20 nm.

The fins 204 may provide an active region where one or more devices are formed. In an embodiment, the channel region 218 is formed in a respective fin 204, which may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 204 may be fabricated using suitable processes including photolithography and etch processes. The photolithography process may include forming a photoresist layer overlying the substrate 202 (e.g., on a silicon layer), exposing the resist to a pattern, performing post-exposure bake processes, and developing the resist to form a masking element including the resist.

The gate dielectric layer 210 of the gate structure 208 may include silicon dioxide. The silicon oxide may be formed by suitable oxidation and/or deposition methods. Alternatively, the gate dielectric layer 210 of the gate structure 208 may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

The gate electrode layer 212 may include a work function layer tuned to have a proper work function for enhanced performance of the field effect transistor devices of finFET. For example, for an n-type finFET, the work function layer includes an n-type work function metal (n-metal), such as Ta, TiAl, TiAlN, TaCN, other n-type work function metal, or a combination thereof. Where the finFET is a p-type, the work function layer includes a p-type work function metal (p-metal), such as TiN, TaN, other p-type work function metal, or combination thereof. In furtherance of the present example, a conductive layer, such as an aluminum layer, is formed over the work function layer, such that the gate electrode layer 212 includes a work function layer disposed over the gate dielectric layer 210 and a conductive layer disposed over the work function layer.

Figure 2B:
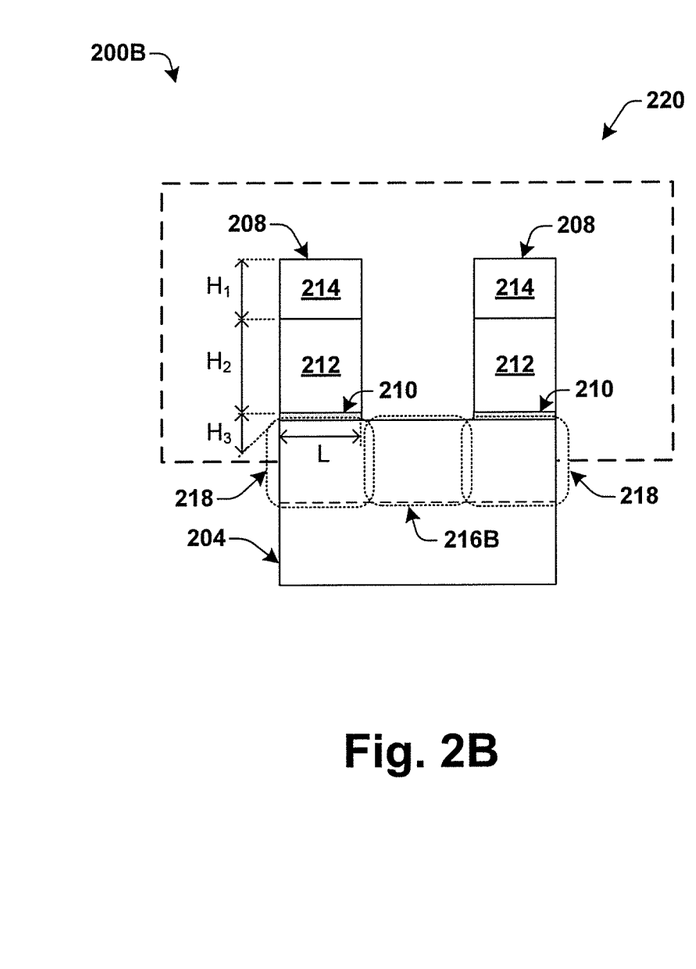

FIGS. 2B-2H illustrate cross-sectional views of some embodiments of epitaxial layer growth of strained source and drain regions of a finFET through asymmetric CDE. The process steps described in the embodiments of FIGS. 2B-2H are analogous to those of FIGS. 1A-1F. FIG. 2B illustrates a cross-sectional view transistor region 200B along cross-section 220 as illustrated in FIG. 2A, and comprises two neighboring gate structures 208 formed over the fin 204 and are separated by a source/drain region, which could either be the source region 216A or the drain region 216B of FIG. 2A. For simplicity of discussion, we designate the source/drain region as drain region 216B. Each gate structure 208 comprises a gate electrode layer 212 and a gate dielectric layer 210. A hard mask layer 214 is disposed over the gate electrode layer 212, and configured to assisting patterning of gate structures 208.

In some embodiments, a thickness $H_1$ of the hard mask layer 214 is in a range from approximately 70 nm to approximately 100 nm. A thickness $H_2$ of gate electrode layer 212 is in a range from approximately 80 nm to approximately 100 nm, in some embodiments. And, a thickness $H_3$ of the gate dielectric layer 210 is in a range from approximately 2 nm to approximately 3 nm, in some embodiments. A channel length L of the channel region 218 is approximately equal to the width of gate electrode layer 212 of a gate structure 208.

Figure 2C:
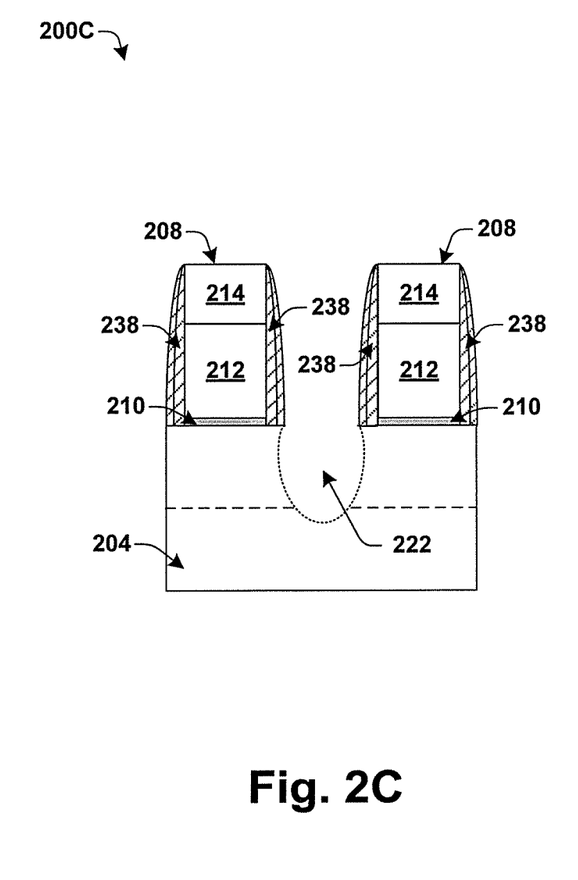

FIG. 2C illustrates a cross-sectional view of transistor region 200C after a recess 222 is formed in the drain region 216B of transistor region 200B, in accordance with some embodiments. The recess 222 may be formed through a dry etch, a wet etch, or a combination thereof. Prior to recessing the drain region 216B, spaces 238 are also formed from a dielectric material, such as silicon oxynitride (SiON), silicon nitride (SiN), or carbon-doped silicon nitride (SiCN), and are configured to isolate the two neighboring gate structures 208 from their respective source/drain regions. A photolithography process could be used to cover other regions (e.g., with hard mask 214) to prevent etching of those regions. As a result, a resist removal process is needed after the etching process and before the next operation. Additional cleaning process could be used to ensure no residual resist remains on the substrate. Note that the etch profile of the recess 222 shapes is merely exemplary. Other shapes are also possible.

Figure 2D:
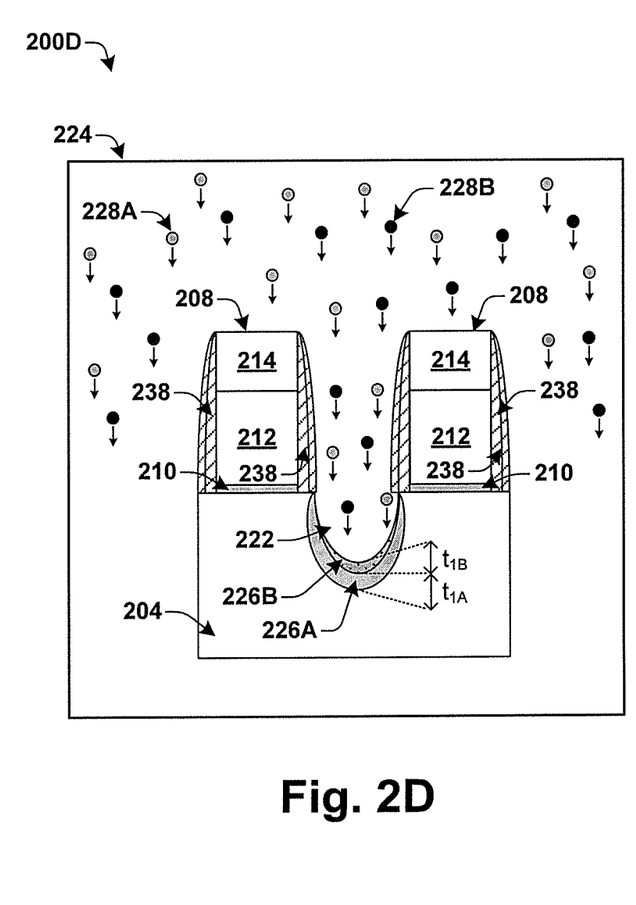

FIG. 2D illustrates a cross-sectional view 200D of the transistor region 200C residing within a processing chamber 224, wherein a first layer of epitaxial material (226A and 226B) is formed within the recess 222. Within the processing chamber 224, the transistor region 200C is exposed to a continuous etchant flow of one or more vapor etchants 228A configured to continuously and selectively remove amorphous portions of the epitaxial material from the fin 204. One or more source vapors 228B is configured to deposit the first layer with a first growth rate (e.g., a reduced growth rate configured to achieve quality epitaxy), wherein the first growth rate is controlled by adjusting a flow rate of the one or more source vapors 228B, or by altering an etch rate by adjusting a temperature or partial pressure of one or more vapor etchants 228A or the temperature within the processing chamber 224. The first layer comprises a crystalline portion 226A comprising a first crystal thickness ($t_{1A}$) and an amorphous portion 226B comprising a first amorphous thickness ($t_{1B}$). Note that for simplicity of understanding the first layer is illustrated with a crystalline portion 226A which is separate and distinct amorphous portion 226B. In some embodiments, the first layer comprises a single layer with localized amorphous, polycrystalline, and crystalline regions.

Figure 2E:
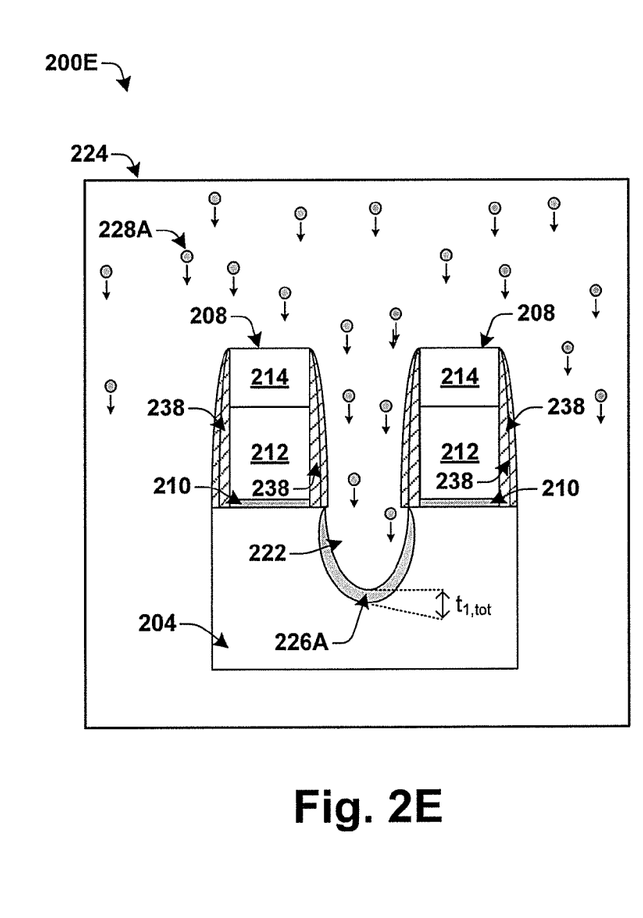
Figure 2F:
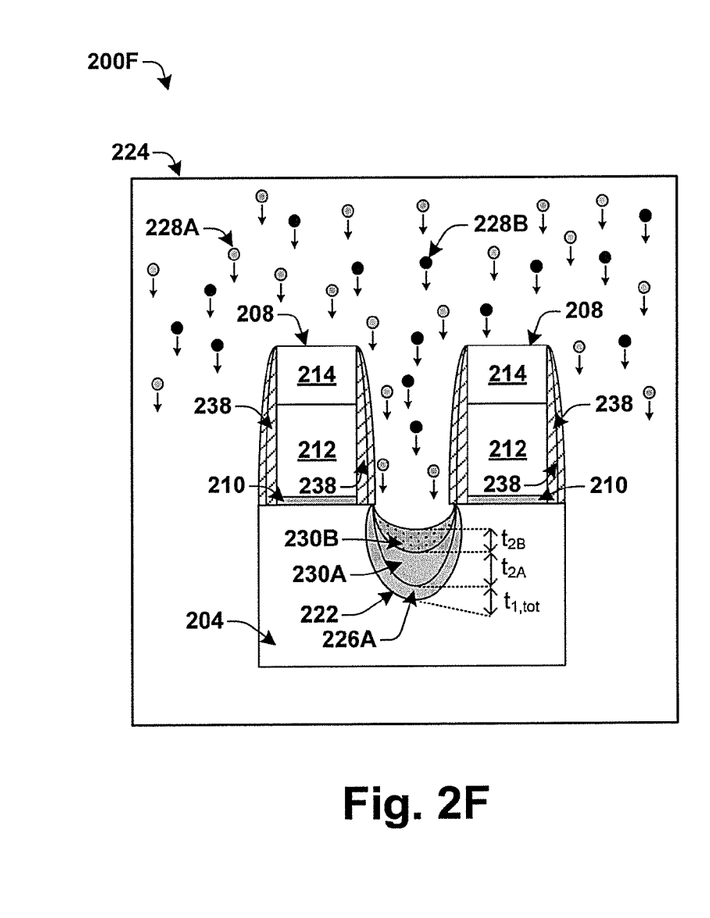

FIG. 2E illustrates a cross-sectional view 200E of the transistor region 200C residing within the processing chamber 224, wherein the one or more source vapors 228B have been turned off to allow a continuous etch of the continuous etchant flow of the one or more vapor etchants 228A which selectively removes the amorphous portion 226B of the first layer, leaving at least a part of the crystalline portion 226A comprising a total first layer thickness ($t_{1,tot}$). FIG. 2F illustrates a cross-sectional view 200F of the of the transistor region 200C residing within the processing chamber 224, wherein a second layer of epitaxial material (230A and 230B) is formed on a surface of the first layer (i.e., crystalline portion 226A) within the recess 222 by the one or more source vapors 228B configured to deposit the second layer with a second growth rate. In some embodiments, the transistor region 200C is periodically exposed to the one or more source vapors 228B to create the first layer within a first period, and the second layer within a second period, etc. The second layer comprises a crystalline portion 230A comprising a second crystal thickness ($t_{2A}$) and an amorphous portion 230B comprising a second amorphous thickness ($t_{2B}$).

Figure 2G:
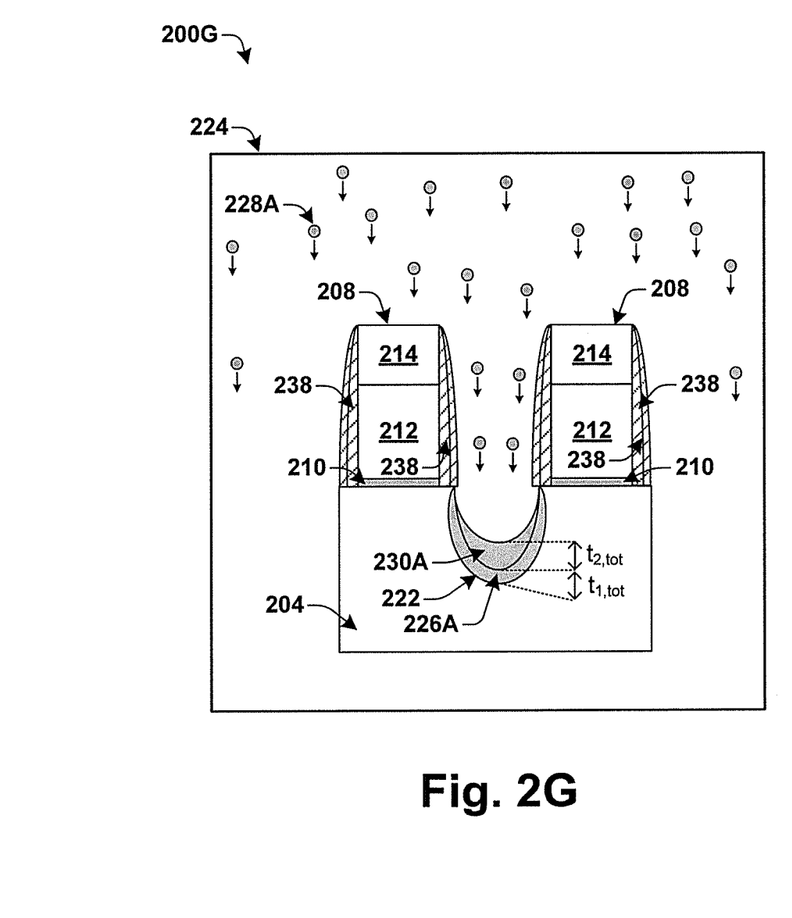
Figure 2H:
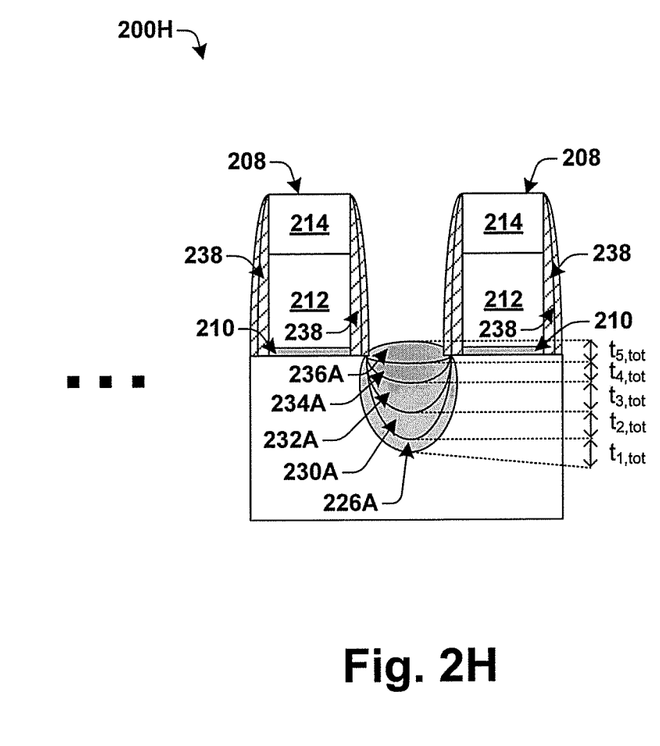

FIG. 2G illustrates a cross-sectional view 200G of the transistor region 200C residing within the processing chamber 224, wherein the one or more source vapors 228B have been again turned off to allow a continuous etch of the continuous etchant flow (228A) to selectively remove the amorphous portion 230B of the second layer, leaving at least a part of the crystalline portion 230A comprising a total second layer thickness ($t_{2,tot}$). FIG. 2H illustrates a cross-sectional view 200H of the transistor region 200C, wherein periodically exposing the recess 222 to the one or more source vapors 228B while continuously exposing the exposing the recess 222 to the continuous etchant flow 228A for three additional periods results in a third layer 232A comprising total third layer thickness ($t_{3,tot}$) disposed above the second layer 230A, and fourth layer 234A comprising a fourth layer thickness ($t_{4,tot}$) disposed above the third layer 232A, and fifth layer 236A comprising a fifth layer thickness ($t_{5,tot}$) disposed above the fourth layer 234A.

In some embodiments the first growth rate is changed to the second growth rate by adjusting an ambient temperature within the processing chamber, a partial pressure of the one or more vapor etchants relative to the source vapor, a flow rate of the one or more source vapors, or a combination thereof. In some embodiments, the transistor region 200C is periodically exposed to the one or more source vapors 228B in a first pulse for a first duration, whereupon completion of the first duration a first thickness of the first layer is determined through ellipsometry, x-ray diffraction (XRD), scanning electron microscopy (SEM), etc., and the first growth rate of the first layer is determined from the first thickness and the first duration. The transistor region 200C is then periodically exposed to the one or more source vapors 228B with the first frequency for the first duration until the first thickness is greater than or equal to a critical thickness of the epitaxial material. For the embodiments of FIG. 2A-2H, a single duration results in a single layer comprising a first thickness further comprising the total first layer thickness ($t_{1,tot}$).

In some embodiments, the transistor region 200C is periodically exposed to the one or more source vapors 228B in a second pulse for a second duration, whereupon completion of the second duration a total thickness of the epitaxial layer is determined, and the second growth rate of the second layer is determined from the total thickness and the second duration. The transistor region 200C is then periodically exposed to the one or more source vapors 228B with the second frequency for the second duration until the total thickness is greater than or equal to a desired threshold. For the embodiments of FIG. 2A-2H, four durations of the second pulse results in a four additional layers 230A-236A disposed above the first layer 226A, a respective layer 230A-236A comprising approximately a second thickness (i.e., $t_{2,tot} \approx t_{3,tot} \approx t_{4,tot} \approx t_{5,tot}$).

Figure 3:
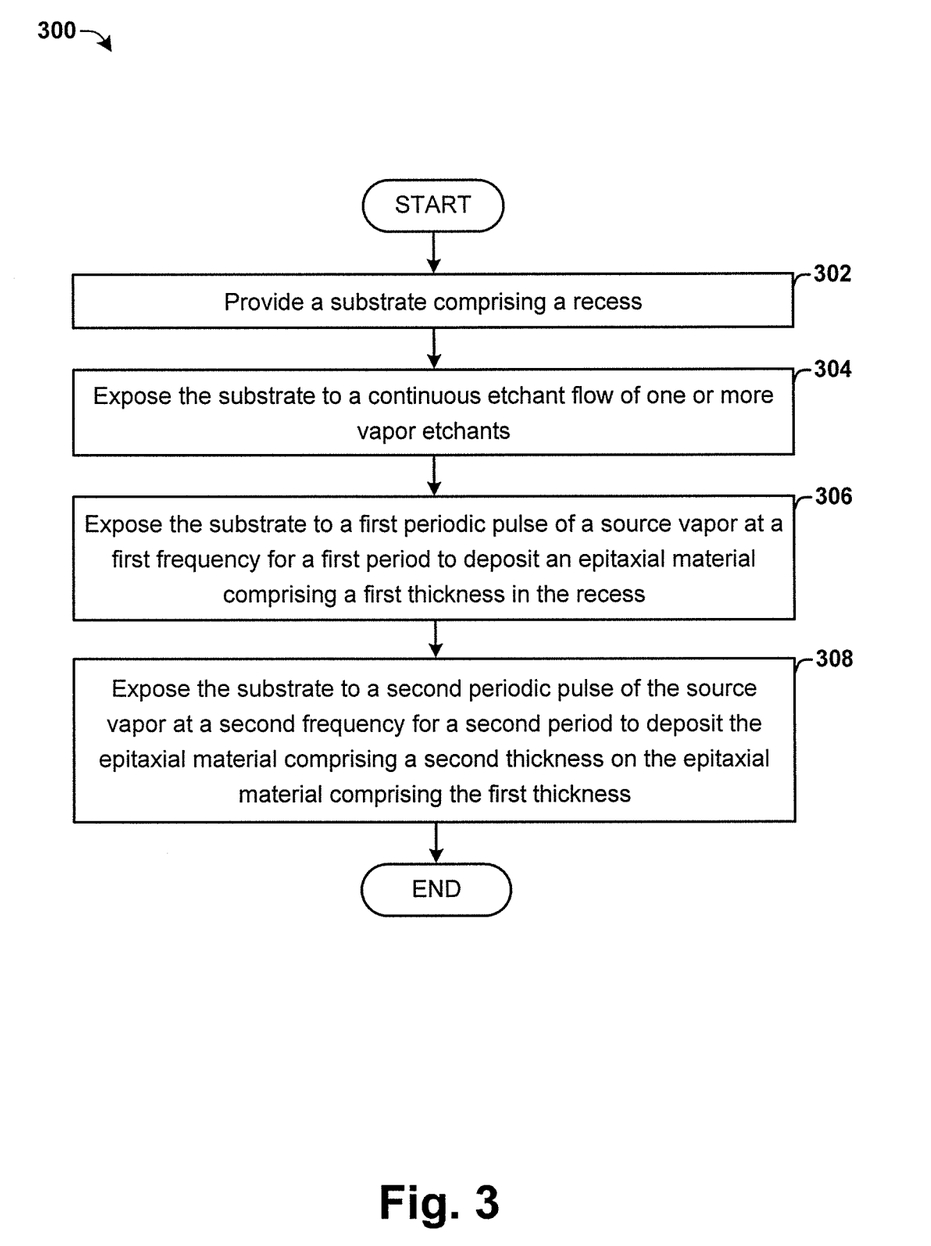
FIG. 3 illustrates some embodiments of a method to form an epitaxial layer within a recess through asymmetric CDE.
Figure 4:
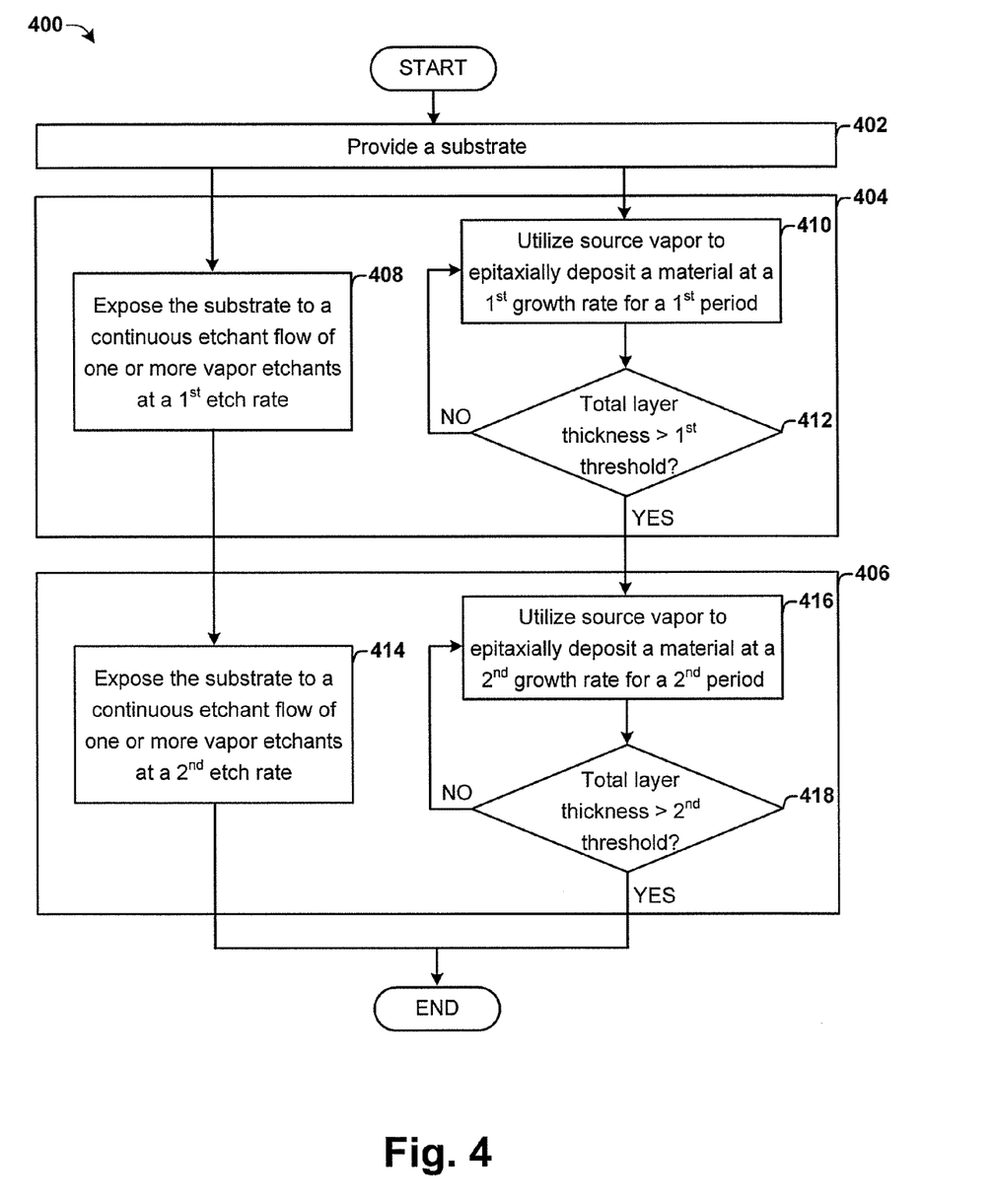
FIG. 4 illustrates some embodiments of a method to form an epitaxial layer on a substrate within a processing chamber through asymmetric CDE.

FIG. 3 illustrates some embodiments of a method 300 to form an epitaxial layer within a recess through asymmetric CDE. FIG. 4 illustrates some embodiments of a method 400 to form an epitaxial layer on a substrate within a processing chamber through asymmetric CDE. While methods 300 and 400 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 3 illustrates some embodiments of a method 300 to form an epitaxial layer within a recess through asymmetric CDE.

At 302 a substrate is provided, the substrate comprising a recess. In some embodiments the substrate comprises a 300 mm or 450 mm Si or SOI wafer, and the surface of the recess comprises a crystalline orientation with Miller indices of [110] or [111].

At 304 the substrate is exposed to a continuous etchant flow of one or more vapor etchants configured to selectively remove amorphous portions of an epitaxial material from the recess.

At 306 the substrate is exposed to a first periodic pulse of one or more source vapors configured to deposit a first layer comprising crystalline portions and amorphous portions of the epitaxial material on a surface within the recess, wherein the first periodic pulse comprises a first frequency and a first duration to achieve a first thickness. In some embodiments, exposing the substrate to a first periodic pulse further comprises determining a first thickness of the first layer after the first duration, determining a first growth rate of the first layer from the first thickness and the first duration, and periodically exposing the substrate to the one or more source vapors with the first frequency for the first duration until the first thickness is greater than or equal to a critical thickness of the epitaxial material. In some embodiments, the first thickness is greater than a critical thickness of the epitaxial material to achieve a strain relaxation within the first layer prior to growth of subsequent layers.

At 308 the substrate is exposed to a second periodic pulse of the one or more source vapors configured to deposit a second layer comprising crystalline portions and amorphous portions of the epitaxial material on a surface of the first layer, wherein the second periodic pulse comprises a second frequency and a second duration to achieve a second thickness. In some embodiments, exposing the substrate to a second periodic pulse further comprises determining a total thickness of the first layer and the second layer after the second duration, determining a second growth rate of the second layer from the total thickness and the second duration, and periodically exposing the substrate to the one or more source vapors with the second frequency for the second duration until the total thickness is greater than or equal to a threshold.

FIG. 4 illustrates some embodiments of a method 400 to form an epitaxial layer on a substrate within a processing chamber through asymmetric CDE.

At 402 a substrate is provided. In some embodiments of forming an n-type FET (NFET), the substrate can be a silicon substrate doped with a p-type dopant, such as boron (resulting in a p-type substrate).

At 404 a first CDE cycle is performed, the first CDE cycle comprising exposing the substrate to a continuous etchant flow configured to continuously and selectively remove amorphous portions of an epitaxial material from the substrate at 408. In some embodiments, the continuous etchant flow comprises chlorine ($Cl_2$), hydrogen chloride (HCl), monogermane ($GeH_4$), or a combination thereof exposed at a pressure between approximately 10 Torr and approximately 90 Torr. The method 400 further comprises periodically exposing the substrate to one or more source vapors with a first periodicity, wherein the one or more source vapors are configured to deposit a first layer of the epitaxial material on a surface of the substrate with a first growth rate at 410. In some embodiments, the one or more source vapors comprise silane ($SiH_4$), di-silane ($Si_2H_6$), or trisilane ($Si_3H_8$), or a combination thereof, further comprising a flow rate of between approximately 100 standard cubic centimeters per minute (sccm) and approximately 400 sccm. The first layer comprises crystalline portions and amorphous portions. In some embodiments, periodically exposing the substrate to the one or more source vapors with the first periodicity further comprises exposing the substrate to the one or more source vapors for a first period, and at 412 determining if a first thickness of the first layer of epitaxial material is less than a first threshold, and periodically exposing the substrate to the one or more source vapors with the first periodicity for the first period until the first thickness is greater than or equal to the first threshold. In some embodiments the first threshold comprises a critical thickness of the epitaxial material.

At 406 a second CDE cycle is performed, wherein an asymmetry between the first CDE cycle and the second CDE cycle is a result of different processing conditions (i.e., pressure, temperature, flow rate, etch rate, etc.). The second CDE cycle comprises exposing the substrate to a continuous etchant flow at 414, wherein the first growth rate is changed to the second growth rate by adjusting an ambient temperature within the processing chamber, a partial pressure of the one or more vapor etchants relative to the source vapor, or a flow rate of the one or more source vapors. At 416, the substrate is exposed to the one or more source vapors with a second periodicity to deposit a second layer of the epitaxial material on a surface of the first layer with the second growth rate, the second layer comprising crystalline portions and amorphous portions at. At 418 a determination is made as to whether a total thickness of the first layer and the second layer of epitaxial material is less than a second threshold comprising a desired thickness of the epitaxial layer. If the total thickness is less than the second threshold, then the method 400 iterates between 416 and 418, periodically exposing the substrate to the one or more source vapors with the second periodicity for the second period until the total thickness is greater than or equal to the second threshold at 418.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method of forming an epitaxial layer through asymmetric CDE epitaxy, wherein an initial layer growth rate of one or more cycles of the CDE process are designed to enhance a crystalline quality of the epitaxial layer. A growth rate of the epitaxial material may be altered by adjusting a flow rate of one or more silicon-containing precursors within a processing chamber wherein the epitaxial growth takes place. A growth rate may also be altered by adjusting a partial pressure of the one or more vapor etchants or the temperature within the processing chamber. An etch rate may also be altered by adjusting a temperature or partial pressure of one or more vapor etchants, or the temperature within the processing chamber. In some embodiments, an initial layer thickness that is greater than a critical thickness of the epitaxial material for strain relaxation is achieved with a low growth rate, followed by a high growth rate for the remainder of epitaxial growth.

In some embodiments the present disclosure relates to a method to form an epitaxial layer on a substrate within a processing chamber, comprising exposing the substrate to a continuous etchant flow configured to continuously and selectively remove amorphous portions of an epitaxial material from the substrate. The method further comprises periodically exposing the substrate to the one or more source vapors with a first periodicity, wherein the one or more source vapors are configured to deposit a first layer of the epitaxial material on a surface of the substrate with a first growth rate, the first layer comprising crystalline portions and amorphous portions. The method further comprises periodically exposing the substrate to the one or more source vapors with a second periodicity to deposit a second layer of the epitaxial material on a surface of the first layer with a second growth rate, the second layer comprising crystalline portions and amorphous portions.

In some embodiments the present disclosure relates to a method to form an epitaxial layer within a recess, comprising providing a substrate comprising a recess, and exposing the substrate to a continuous etchant flow of one or more vapor etchants configured to selectively remove amorphous portions of an epitaxial material from the recess. While continuing to expose the substrate to the etchant flow, the method comprises exposing the substrate to a first periodic pulse of one or more source vapors configured to deposit a first layer comprising crystalline portions and amorphous portions of the epitaxial material on a surface within the recess, wherein the first periodic pulse comprises a first frequency and a first duration to achieve a first thickness. While continuing to expose the substrate to the etchant flow, the method further comprises exposing the substrate to a second periodic pulse of the one or more source vapors configured to deposit a second layer comprising crystalline portions and amorphous portions of the epitaxial material on a surface of the first layer, wherein the second periodic pulse comprises a second frequency and a second duration to achieve a second thickness.

In some embodiments the present disclosure relates to a field-effect transistor (FET) formed on a substrate, comprising a source region comprising an epitaxial material, a drain region comprising the epitaxial material, and a gate disposed above a channel region which resides between the source region and the drain region, wherein the source region or drain region comprise a first plurality of first layers sequentially and epitaxially disposed above one another and the substrate to form a first layer comprising a first thickness, and wherein the source region or drain region further comprise a second plurality of second layers sequentially and epitaxially disposed above one another and a first layer to form a second layer comprising a second thickness.

What is claimed is:

1. A method to form an epitaxial layer on a substrate within a processing chamber, comprising:
   exposing the substrate to a continuous etchant flow of one or more vapor etchants to continuously and selectively remove amorphous portions of an epitaxial material from the substrate;
   while exposing the substrate to the continuous etchant flow, providing first intermittent pulses of one or more source vapors to deposit a first layer of the epitaxial material on a surface of the substrate with a first growth rate; and
   after providing the first intermittent pulses of the one or more source vapors, and while exposing the substrate to the continuous etchant flow, providing second intermittent pulses of the one or more source vapors to deposit the epitaxial material with a second growth rate, which is different than the first growth rate.

2. The method of claim 1, wherein providing the first intermittent pulses comprises:
   exposing the substrate to the one or more source vapors for a first duration;
   determining a first thickness of the epitaxial material after the first duration;
   determining the first growth rate of the epitaxial material from the first duration and the first thickness; and
   exposing the substrate to the one or more source vapors with a first frequency selected to maintain the first growth rate until the first thickness is greater than or equal to a first threshold.

3. The method of claim 2, wherein providing the second intermittent pulses comprises:
   exposing the substrate to the one or more source vapors for a second duration;
   determining second thickness of the epitaxial material after the second duration;
   determining the second growth rate of the epitaxial material from the second duration, the first thickness, and the second thickness; and
   periodically the substrate to the one or more source vapors with a second frequency selected to maintain the second growth rate until the second thickness is greater than or equal to a second threshold.

4. The method of claim 1, wherein the first growth rate is changed to the second growth rate by adjusting an etch rate of the one or more vapor etchants.

5. The method of claim 4, wherein adjusting the etch rate comprises changing a partial pressure of the one or more vapor etchants within the processing chamber.

6. The method of claim 1, wherein the first growth rate is changed to the second growth rate by adjusting a flow rate of the one or more source vapors within the processing chamber.

7. The method of claim 1, the one or more vapor etchants comprising chlorine ($Cl_2$), hydrogen chloride (HCl), monogermane ($GeH_4$), or a combination thereof.

8. The method of claim 1, the one or more source vapors comprising silane ($SiH_4$), di-silane ($Si_2H_6$), or trisilane ($Si_3H_8$), or a combination thereof.

9. The method of claim 1,
wherein the first intermittent pulses are provided at a first frequency; and
wherein the second intermittent pulses are provided at a second frequency, which is greater than the first frequency.

10. The method of claim 3, wherein the second duration is less than the first duration.

11. A method to form an epitaxial layer, comprising:
providing a substrate within a processing chamber;
exposing the substrate to a continuous etchant flow of one or more vapor etchants to selectively remove amorphous portions of an epitaxial material;
while exposing the substrate to the continuous etchant flow, providing first intermittent pulses of one or more source vapors to deposit a first layer comprising crystalline portions and amorphous portions of the epitaxial material on a top surface of the substrate, wherein the first intermittent pulses comprise a first frequency to achieve a first growth rate; and
after providing the first intermittent pulses of the one or more source vapors, and while exposing the substrate to the continuous etchant flow, providing second intermittent pulses of the one or more source vapors to deposit a second layer, comprising crystalline portions and amorphous portions of the epitaxial material, on a top surface of the first layer, wherein the second intermittent pulses comprise a second frequency, which is different from the first frequency to achieve a second growth rate, which is different than the first growth rate.

12. The method of claim 11, wherein providing the first intermittent pulses comprises:
determining a first thickness of the first layer after a first duration;
determining the first growth rate of the first layer from the first thickness and the first duration; and
exposing the substrate to the first intermittent pulses of the one or more source vapors with the first growth rate until the first thickness is greater than or equal to a threshold thickness of the epitaxial material, which achieves strain relaxation within the epitaxial material.

13. The method of claim 12, wherein the first growth rate is further changed to the second growth rate by adjusting:
an ambient temperature within the processing chamber;
an ambient pressure within the processing chamber;
a partial pressure of the one or more vapor etchants;
a partial pressure of the one or more source vapors;
a first flow rate of the one or more vapor etchants; or
a second flow rate of the one or more source vapors.

14. A method of forming a strained channel on a substrate within a processing chamber, comprising:
exposing the substrate to a continuous etchant flow of one or more vapor etchants to continuously and selectively remove amorphous portions of an epitaxial material from the substrate;
while exposing the substrate to the continuous etchant flow, providing first intermittent pulses of one or more source vapors at a first frequency to deposit a first layer of the epitaxial material on a top surface of the substrate with a first growth rate; and
adjusting an etch rate of the one or more vapor etchants while providing the first intermittent pulses of the one or more source vapors, to deposit a second layer of the epitaxial material on a top surface of the first layer with a second growth rate, which is different than the first growth rate.

15. The method of claim 14, wherein adjusting the etch rate of the one or more vapor etchants comprises changing an ambient temperature within the processing chamber, an ambient pressure within the processing chamber, or a partial pressure of the one or more vapor etchants.

16. The method of claim 14, further comprising:
after providing the first intermittent pulses of the one or more source vapors, and while exposing the substrate to the continuous etchant flow, providing second intermittent pulses of the one or more source vapors at a second frequency, which is different than the first frequency, to deposit the epitaxial material.

17. The method of claim 14, wherein the second growth rate is greater than the first growth rate.

18. The method of claim 16, wherein the first growth rate is changed to the second growth rate by adjusting:
a partial pressure of the one or more source vapors;
a first flow rate of the one or more vapor etchants; or
a second flow rate of the one or more source vapors.

19. The method of claim 14, the one or more vapor etchants comprising chlorine ($Cl_2$), hydrogen chloride (HCl), monogermane ($GeH_4$), or a combination thereof.

20. The method of claim 14, the one or more source vapors comprising silane ($SiH_4$), di-silane ($Si_2H_6$), or trisilane ($Si_3H_8$), or a combination thereof.

* * * * *

UNITED STATES PATENT AND TRADEMARK OFFICE
CERTIFICATE OF CORRECTION

PATENT NO. : 8,906,789 B2  
APPLICATION NO. : 13/873323  
DATED : December 9, 2014  
INVENTOR(S) : Tsai et al.

Page 1 of 1

It is certified that error appears in the above-identified patent and that said Letters Patent is hereby corrected as shown below:

In the Claim  
Column 12, Claim 3, Line 66 replace "periodically the substrate to the..." with --exposing the substrate to the...--

Signed and Sealed this  
Third Day of March, 2015

Michelle K. Lee  
*Deputy Director of the United States Patent and Trademark Office*